United States Patent [19]

Ioku et al.

[11] Patent Number: 4,582,561
[45] Date of Patent: Apr. 15, 1986

[54] METHOD FOR MAKING A SILICON CARBIDE SUBSTRATE

[75] Inventors: Toshinori Ioku; Takeshi Sakurai, both of Nara, Japan

[73] Assignee: Sharp Kabushiki Kaisha, Osaka, Japan

[21] Appl. No.: 369,911

[22] Filed: Apr. 19, 1982

Related U.S. Application Data

[63] Continuation-in-part of Ser. No. 113,963, Jan. 21, 1980, abandoned.

[30] Foreign Application Priority Data

| Jan. 25, 1979 | [JP] | Japan | 54-7834 |
| Jan. 29, 1979 | [JP] | Japan | 54-10199 |
| Apr. 26, 1979 | [JP] | Japan | 54-52198 |
| Apr. 28, 1979 | [JP] | Japan | 54-53934 |
| May 7, 1979 | [JP] | Japan | 54-56120 |
| May 7, 1979 | [JP] | Japan | 54-56134 |
| May 7, 1979 | [JP] | Japan | 54-56129 |
| May 7, 1979 | [JP] | Japan | 54-56118 |
| Sep. 19, 1979 | [JP] | Japan | 54-121280 |
| Sep. 19, 1979 | [JP] | Japan | 54-121279 |

[51] Int. Cl.⁴ ............................................. C30B 19/00
[52] U.S. Cl. ............................ 156/624; 156/DIG. 64
[58] Field of Search ............. 156/624, DIG. 64, 610, 156/612, 614, 621, 622; 423/346, 349; 427/86, 95, 93, 248.1, 255.2; 118/715, 720; 148/175

[56] References Cited

U.S. PATENT DOCUMENTS

| 2,414,679 | 1/1947 | West | 156/624 |
| 2,996,456 | 8/1961 | Hergenruther | 252/62.3 |
| 3,082,126 | 3/1963 | Chang | 148/175 |
| 3,663,722 | 5/1972 | Kamath | 148/172 |
| 3,769,104 | 10/1973 | Ono et al. | 427/94 |
| 3,773,571 | 11/1973 | Rupprecht et al. | 156/621 |
| 4,000,020 | 12/1976 | Gartman | 156/610 |
| 4,013,503 | 3/1977 | Knippenberg et al. | 156/624 |
| 4,147,584 | 4/1979 | Garrison et al. | 156/603 |

FOREIGN PATENT DOCUMENTS

| 0043200 | 4/1979 | Japan | 156/DIG. 64 |
| 0104488 | 8/1979 | Japan | 156/DIG. 64 |
| 0144500 | 11/1980 | Japan | 156/DIG. 64 |
| 0144499 | 11/1980 | Japan | 156/DIG. 64 |
| 7002110 | 8/1970 | Netherlands | 156/DIG. 64 |

Primary Examiner—Hiram H. Bernstein
Attorney, Agent, or Firm—Birch, Stewart, Kolasch & Birch

[57] ABSTRACT

A silicon carbide seed layer is first formed on a (111) major surface of a silicon substrate through the use of the conventional chemical vapor deposition method. The silicon carbide seed layer includes a first surface confronting the silicon substrate. The first surface shows a predetermined grain alignment oriented with the (111) major surface of the silicon substrate even though the deposition is carried out at a temperature below the melting point of the silicon substrate. Then, the silicon substrate is melted so that the first surface of the silicon carbide seed layer is exposed to the molten silicon including a carbon source therein. In this way, a second silicon carbide layer is formed on the first surface of the silicon carbide seed layer through the use of a liquid-phase epitaxial growth method. If required, a third silicon carbide layer is formed on the second silicon carbide layer to thicken the silicon carbide substrate through the use of a conventional chemical vapor deposition method, wherein the substrate is maintained at a temperature above the melting point of silicon to ensure the high-quality crystallization.

10 Claims, 23 Drawing Figures

METHOD FOR MAKING A SILICON CARBIDE SUBSTRATE

This application is a continuation-in-part of U.S. Application Ser. No. 113,963 filed Jan. 21, 1980 now abandoned.

BACKGROUND OF THE INVENTION

The present invention relates to a method for making a silicon carbide (SiC) substrate and, more particularly, to a method for making a substrate including a single crystal silicon carbide (SiC) layer formed through a liquid-phase epitaxial growth method.

Silicon Carbide (SiC) takes various kinds of crystal structures (referred to as Polytype), and has a band gap between 2.4 eV and 3.3 eV depending on the crystal strucure. The silicon carbide is thermally, chemically and physically stable, and resistant to high-energy particle radiation. Moreover, stable P-type and N-type substrates can be formed through the use of silicon carbide even though the silicon carbide has a wide band gap.

Accordingly, silicon carbide (SiC) is favorable for the semiconductor material of, for example, a high temperature operating device, a high power device, a high reliability semiconductor device and a radiation resistant device. By effectively utilizing the wide band gap, the silicon carbide (SiC) may provide a novel opto-electric converter sensitive to rays between the visible shortwave length light region and the near ultraviolet ray region. In addition, the silicon carbide (SiC) is free from certain problems related to pollution and resources.

Even though silicon carbide has various advantages as discussed above, a silicon carbide substrate has never been produced for commercial use.

Three methods are well known in the art to fabricate a silicon carbide substrate on a laboratory scale.

(1) LELY method

Silicon carbide powder is vaporized in a graphite crucible at 2200° C. through 2600° C., and silicon carbide single crystals are recrystallized on the crucible wall.

(2) Solution Growth method

Silicon carbide substrates are obtained from molten silicon, or a mixture comprising silicon and impurity such as iron, cobalt or platinum, in a graphite crucible.

(3) ACHESON method

A silicon carbide substrate is incidentally formed by the Acheson method which is widely employed for providing a lapping powder.

The Lely method and the solution growth method are not suited for providing a large size silicon carbide substrate because many crystallization nuclei are formed at the beginning of the crystal growth operation. Moreover, the two methods are not preferable for providing a large size silicon carbide substrate of the single crystal structure because various kinds of polytypes are inevitably formed. The silicon carbide substrate incidentally obtained through the Acheson method does not show high purity, and the crystal quality thereof is not good enough for use as a semiconductor material.

Recently, a new method has been proposed, wherein a single crystal thin-film of 3C—SiC (shows the polytype belonging to the cubic structure and has the energy gap around 2.2 eV) is formed on a single crystal silicon foreign substrate through the use of the heteroepitaxy technique. SiC includes Si and C by a 1:1 ratio. However, the alignment is not fixed. Therefore, the term "polytype" is used. The expression "3C" means one type of polytype. The SiC formed by the present method shows the 3C type. Three methods are proposed for the heteroepitaxial growth of the single crystal thin-film SiC on the silicon substrate.

(1) The 3C—SiC single crystal thin-film is formed on the silicon substrate through the use of the chemical vapor deposition (CVD) technique while the silicon substrate is held at 1200° C. through 1400° C.

silicon source: $SiH_4$, $SiCl_4$, $(CH_3)_3SiCl$, $(CH_3)_2SiCl_2$ carbon source: $CCl_4$, hydro-carbon gas ($C_2H_2$, $C_2H_6$, $CH_4$, $C_3H_8$, etc.)

carrier gas: hydrogen, argon (2) The 3C—SiC single crystal thin-film is formed on the silicon substrate by converting the silicon substrate surface into SiC, wherein carbon atoms, which are derived from graphite or hydro-carbon due to the thermal decomposition, are diffused into the silicon substrate surface at 1200° C. through 1400° C.

(3) Silicon vapor is forced to pass through argon and hydro-carbon gas activated by the D.C. or A.C. glow discharge, whereby the SiC single crystal thinfilm is deposited on the silicon substrate.

The 3C—SiC single crystal thin-film formed on the silicon foreign substrate through the use of the above-discussed heteroepitaxy techniques has a thickness of only 1 through 10 μm and the crystal quality thereof is not completely preferred. This is because a lot of misfit dislocations are created near the boundary of the silicon substrate and the epitaxial 3C—SiC layer due to a great difference of the latice constant between the silicon crystal and the 3C—SiC crystal, and the misfit dislocation influences the entire epitaxial growth. This is further because a strain is accumulated in the SiC epitaxial layer during the cooling process due to a difference of the thermal expansion coefficient between the silicon substrate and the SiC crystal.

Moreover, the above-mentioned methods are not suited for providing a wider energy gap α-SiC, for example, 6H—SiC (having the energy gap of about 3.02 eV), 4H—SiC (having the energy gap of about 3.26 eV), 8H—SiC (having the energy gap of about 2.8 eV), since the silicon substrate cannot be employed as the substrate. More specifically, the epitaxial growth for forming the wider energy gap SiC must be controlled above 1600° C. though the silicon substrate has a melting point of 1410° C.

OBJECTS AND SUMMARY OF THE INVENTION

Accordingly, an object of the present invention is to provide a silicon carbide substrate for commercial use.

Another object of the present invention is to provide a novel method for providing a silicon carbide substrate at a high yield.

Still another object of the present invention is to make a silicon carbide substrate by properly combining the chemical vapor deposition (CVD) technique and the liquid-phase epitaxial (LPE) growth technique.

Yet another object of the present invention is to provide a method for making silicon carbide substrate, wherein the size of the silicon carbide substrate and the thickness of the silicon carbide substrate are not limited.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a silicon carbide seed layer is first formed on a silicon substrate to the thickness around 20 μm through the use of, for example, the chemical vapor deposition method. Thereafter, the silicon substrate is melted to expose the inner surface of the silicon carbide seed layer to the molten silicon, whereby the silicon carbide crystal is epitaxially grown on the inner surface of the silicon carbide seed layer.

In a preferred form, another silicon carbide layer is formed on the epitaxially grown silicon carbide layer through the use of the chemical vapor deposition method to thicken the silicon carbide substrate.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
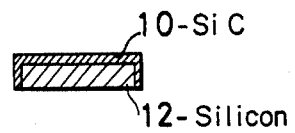
FIG. 1 is a schematic sectional view of a base plate for making a silicon carbide substrate in accordance with a first embodiment of the present invention.

FIG. 1 schematically shows a base plate used in a first embodiment of the present invention.

A silicon carbide seed layer 10 is first formed on a silicon substrate 12 through the use of the conventional chemical vapor deposition method. The silicon carbide seed layer 10 must have crystal grains which are aligned in a predetermined orientation at the boundary section confronting the silicon substrate 12. The silicon carbide seed layer 10 can be formed by other methods, for example, a conversion method which utilizes the thermal conversion or the chemical conversion, a molecular beam epitaxy method, other deposition methods, and the combination thereof. The silicon carbide seed layer 10 must be tolerant of the following melting step and, therefore, has a thickness of at least 5 through 10 μm, and preferably 20 μm.

Figure 2:
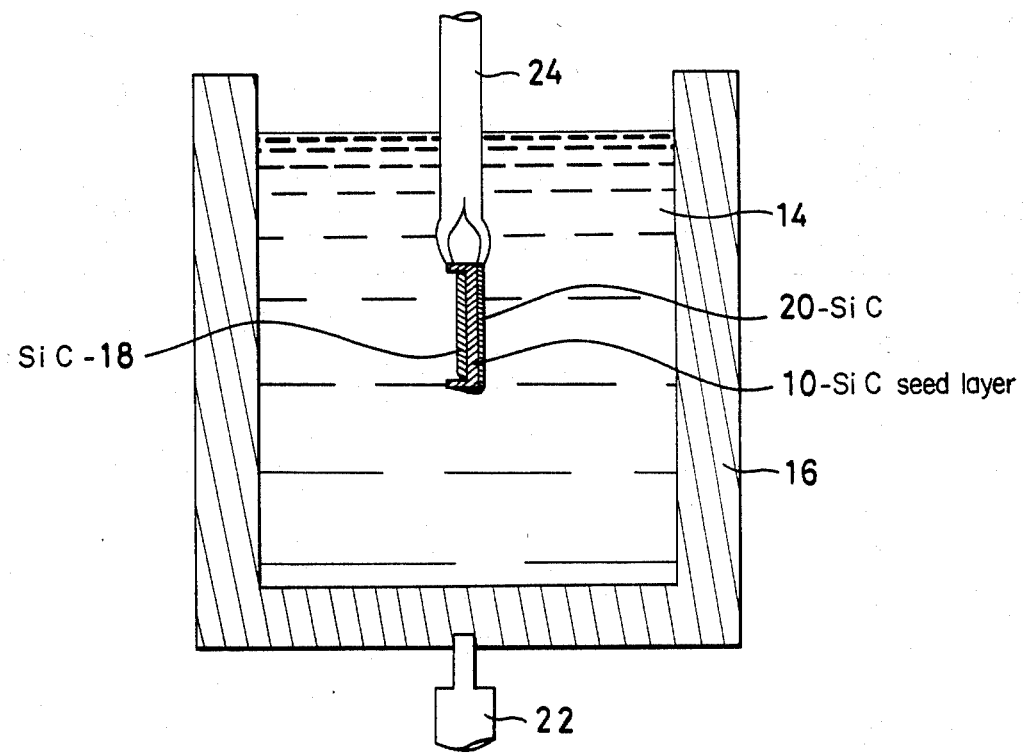
FIG. 2 is a schematic sectional view showing one step of the first embodiment of a method for making a silicon carbide substrate of the present invention.

The thus formed base plate is dipped into molten silicon 14 contained by a crucible carbon source 16 as shown in FIG. 2. A second silicon carbide layer 18 is formed on the inner surface of the silicon carbide seed layer 10 (which has confronted the silicon substrate 12) by virtue of the liquid-phase epitaxial growth. Before dipping the base plate into the molten silicon 14, the silicon substrate 12 is either removed or not removed. If the silicon substrate 12 is not removed in advance, the silicon substrate 12 is melted when the base plate is dipped into the molten silicon 14.

Generally, the crystal formed by the liquid-phase epitaxial growth has higher quality than the crystal formed by the chemical vapor deposition. However, it is normally difficult in the liquid-phase growth to determine the crystal size because, in the usual liquidphase growth, the crystal nucleus is not controllable. In accordance with the present invention, the second silicon carbide layer 18 is formed on the inner surface of the silicon carbide seed layer 10. The size and the orientation of the silicon carbide seed layer 10 can be controlled by those of the silicon substrate 12. Even though the silicon carbide seed layer 10 is formed on the silicon substrate 12 through the use of the heteroepitaxial growth, the silicon carbide seed layer 10 shows the single crystal structure within the depth below 1 μm from the boundary section confronting the silicon substrate 12. There is no problem even when the outer surface of the silicon carbide seed layer 10 shows the polycrystal structure.

Accordingly, the silicon carbide substrate formed by the present method has a second silicon carbide layer 18 suited for the planar technique, i.e., the formation of semiconductor devices thereon. Another silicon carbide layer 20 is also formed on the outer surface of the silicon carbide seed layer 10, but the silicon carbide layer 20 is less complete than the second silicon carbide layer 18.

The crucible 16 is preferably made of graphite, and supported by a graphite leg 22. The graphite crucible 16 is heated to provide the molten silicon 14. The base plate is held by a graphite holder 24 and dipped into the molten silicon 14.

[EXAMPLE]

(FIGS. 1 and 2)

(1) The silicon substrate 12 is disposed on a susceptor within a reactor tube which is widely used in the chemical vapor deposition technique. The silicon substrate 12 preferably has the major surface defined by the (111) type surface further discussed below. The interior of the reactor tube is substituted by hydrogen gas. Thereafter, the surface of the silicon substrate 12 is etched through the use of mixture gas comprising hydrogen chloride and hydrogen.

(2) The silicon carbide seed layer 10 is formed on the silicon substrate 12 through the use of the conventional chemical vapor deposition technique under the condition where the silicon substrate 12 is held at 1100° C. through 1200° C., which is below the melting point of silicon. Argon, helium or hydrogen is used for the carrier gas. Either $SiCl_4$, $SiH_2Cl_2$ or $SiH_4$ is used for the silicon source, and $CCl_4$, $C_3H_8$ or $CH_4$ is used for the carbon source. In a preferred form, hydrogen gas having a flow rate of 1l/min. is used for the carrier gas, and $SiH_2Cl_2$ and $C_3H_8$ are employed as the source gas. The concentration of $SiH_2Cl_2$ and $C_3H_8$ in atomic ratio is $2 \times 10^{-3}$ and $4 \times 10^{-3}$, respectively. A 3C—SiC seed layer 10 of 30 μm thick is formed by a two hour growth. It will be clear that the SiC seed layer 10 is formed not only on the major surface of the silicon substrate 12 but also on the side surface of the silicon substrate 12 as shown in FIG. 1.

(3) The graphite crucible 16 is heated up and maintained at 1600° C. The base plate comprising the silicon substrate 12 and the silicon carbide seed layer 10 is dipped into the molten silicon 14. The graphite holder 24 holds the base plate at the SiC seed layer formed on the side surface of the silicon substrate 12. The inner surface of the graphite crucible 16 melts into the melted silicon 14, and functions as the carbon source. The second silicon carbide layer 18 is formed on the inner surface of the silicon carbide seed layer 10 to 30 μm thick after a one hour dip. The silicon carbide layer 20 is also formed on the outer surface of the silicon carbide seed layer 10.

(4) The thus obtained silicon carbide substrate comprising the seed layer 10, the second silicon carbide layer 18 and the silicon carbide layer 20 is removed from the molten silicon 14, and the surface thereof is cleaned up through the use of an acid mixture of HF and $HNO_3$ to remove the silicon fixed to the substrate surface.

FIGS. 3 and 4(A) through 4(D) show a second embodiment of the method for making the silicon carbide substrate of the present invention.

Figure 3:
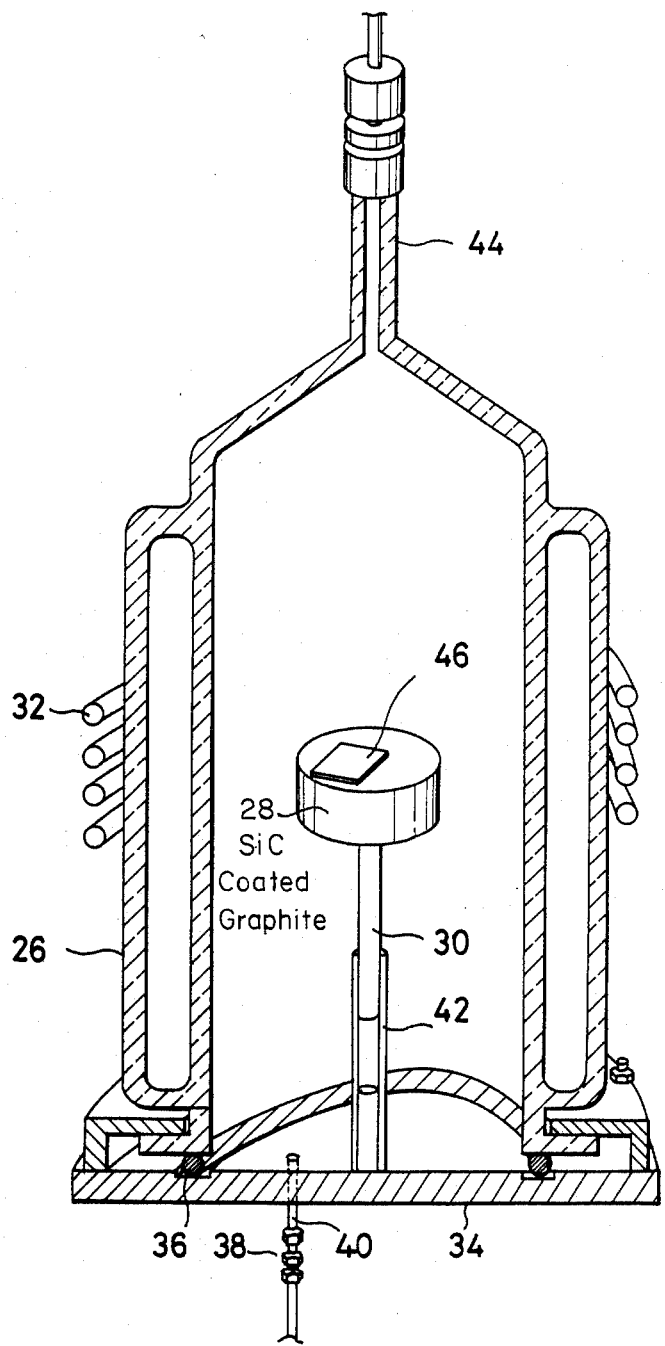
FIG. 3 is a sectional view of a reactor tube employed in a second embodiment of the present invention.

FIG. 3 shows a water-cooled double-wall quartz reactor tube 26 employed by the second embodiment of the present invention. In the second embodiment, a graphite susceptor 28 coated with a silicon carbide layer is employed. The SiC coated graphite susceptor 28 is disposed within the reactor tube 26 and supported by a graphite leg 30. A coil 32 is disposed around the reactor tube 26 for heating up the susceptor 28 through the use of radio frequency induction heating. The bottom end of the reactor tube 26 is sealed through the use of a stainless steel flange 34 and an O-shaped ring 36. A valve 38 and a conduit 40 are communicated to the interior of the reactor tube 26 through the flange 34 to take out the gas contained in the reactor tube 26. The graphite leg 30 is supported on the flange 34 via a quartz supporter 42. An inlet portion 44 is formed at the upper section of the reactor tube 26 for introducing the carrier gas into the reactor tube 26.

The second embodiment of the method for making the silicon carbide substrate will be described with reference to FIG. 4(A) through 4(D).

[EXAMPLE]

(FIGS. 3 and 4(A) through 4(D))

Figure 4:
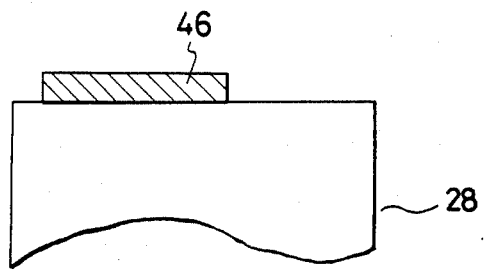
FIGS. 4(A) through 4(D) are sectional views showing fabrication steps of a silicon carbide substrate in accordance with the second embodiment of the present invention.
Figure 4:
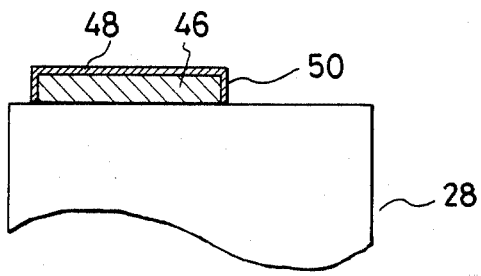
Figure 4:
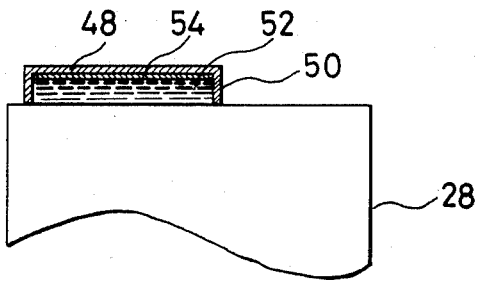
Figure 4:
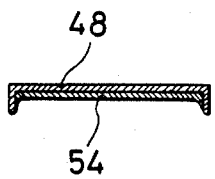

(1) A silicon substrate 46 is disposed on the SiC coated graphite susceptor 28 as shown in FIG. 4(A). The silicon substrate 46 preferably has the (111) major surface. The gas contained in the reactor tube 26 is first exhausted and a hydrogen gas is introduced into the reactor tube 26. Thereafter, the surface of the silicon substrate 46 is etched through the use of a mixture gas comprising hydrogen chloride and hydrogen.

(2) A silicon carbide seed layer 48 is formed on the silicon substrate 46 through the use of the conventional chemical vapor deposition technique under the condition where the silicon substrate 46 is held at 1100° C. through 1200° C., which is below the melting point of silicon. Argon, helium or hydrogen gas is introduced through the inlet portion 44 as the carrier gas; $SiCl_4$, $SiH_2Cl_2$ or $SiH_4$ functioning as the silicon source, and $CCl_4$, $C_3H_8$ or $CH_4$ functioning as the carbon source are also introduced through the inlet portion 44. In a preferred form, the hydrogen gas at a flow rate of 1l/min. is used for the carrier gas, and $SiH_2Cl_2$ and $C_3H_8$ are introduced at the concentration of $2 \times 10^{-3}$ and $4 \times 10^{-3}$ atomic ratio, respectively. A 3C—SiC seed layer 48 of 30 μm thick is formed at the end of a two hour growth. A silicon carbide seed layer 50 is also formed on the side wall of the silicon substrate 46 as shown in FIG. 4(B).

(3) The material gas supply is terminated, and only the hydrogen carrier gas is introduced at the flow rate of 1l/min. The electric power applied to the coil 32 is increased to heat the susceptor 28 up to around 1500° C. for melting the silicon substrate 46. After the melting operation, the susceptor 28 is maintained at 1450° C. through 1650° C. to hold the silicon in the molten condition. In a preferred form, the susceptor surface is maintained at 1500° C. The molten silicon 52 is retained in the section surrounded by the silicon carbide seed layers 48 and 50 and the susceptor 28, and a second silicon carbide layer 54 is formed on the inner surface of the silicon carbide seed layer 48 to 10 μm thick after a two hour liquid-phase epitaxial growth period as shown in FIG. 4(C).

(4) The power supply to the coil 32 is terminated to cool the system to the room temperature. The thus obtained silicon carbide substrate inclusive of the susceptor 28 is dipped into an acid mixture comprising HF and $HNO_3$, to etch the silicon fixed to the silicon carbide substrate and the susceptor 28. In this way, the silicon carbide substrate, which comprises the 3C—SiC seed layer 48 and the second silicon carbide layer 54 as shown in FIG. 4(D), is demounted from the susceptor 28.

In the above-mentioned step (3), it is proposed that the SiC layer coated on the graphite susceptor 28 provides the primary source for the carbon material for forming the second silicon carbide layer 54. However, the silicon carbide seed layer 50 can be considered to provide a negligible amount of the carbon material in the formation of the layer 54. Since the susceptor 28 functions as the heat source, a temperature difference is created between the inner surface of the silicon carbide seed layer 48 and the susceptor surface. This temperature difference promotes the liquid-phase epitaxial growth of the second silicon carbide layer 54 on the inner surface of the silicon carbide seed layer 48.

In the above-mentioned second embodiment, only the temperature at the surface of the susceptor 28 is controllable. It is preferred that the temperature of the silicon carbide seed layer 48 be controlled while the second silicon carbide layer 54 is epitaxially grown on the inner surface of the silicon carbide seed layer 48, also.

Figure 5:
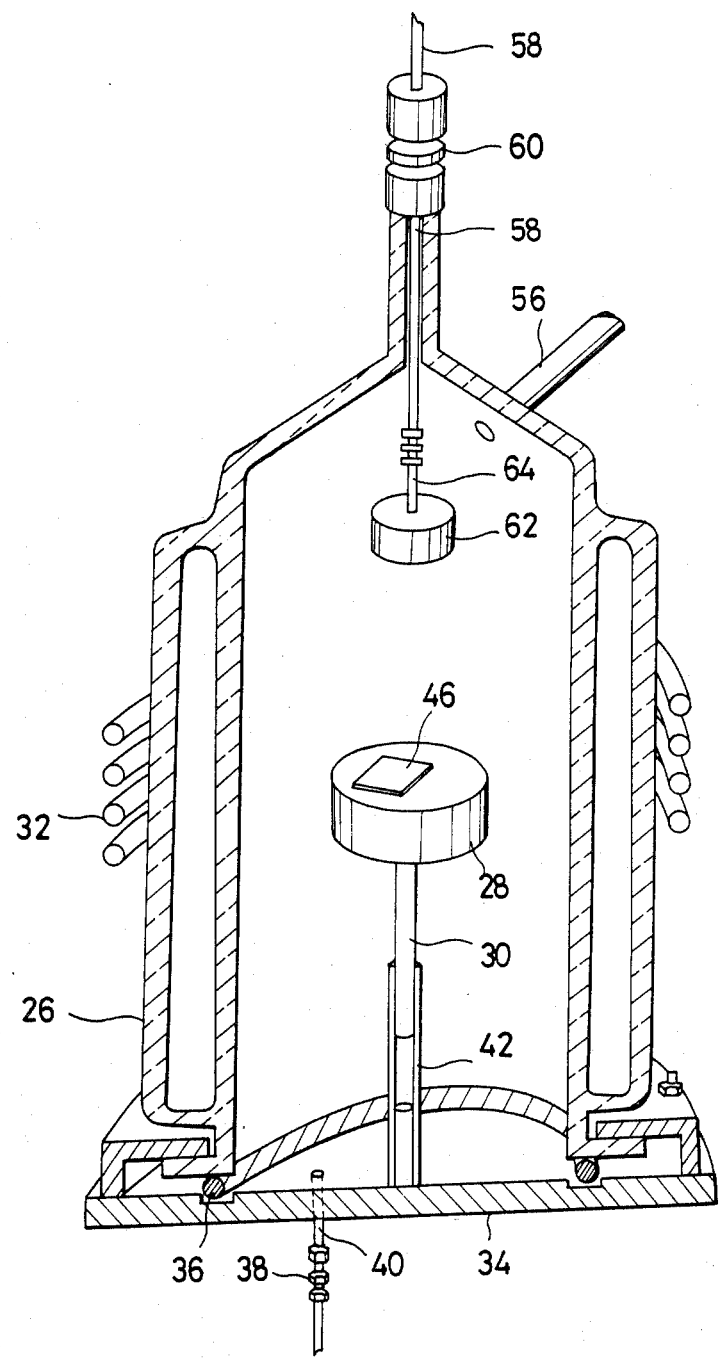
FIG. 5 is a sectional view of a reactor tube employed in a third embodiment of the present invention.

FIG. 5 shows a water-cooled reactor tube employed in a third embodiment of the present invention, wherein the temperature of the silicon carbide seed layer is controllable while the second silicon carbide layer is epitaxially grown on the inner surface of the silicon carbide seed layer. Like elements corresponding to those of FIG. 3 are indicated by like numerals.

A conduit 56 is connected to the reactor tube 26 for introducing the carrier gas and the source gases into the reactor tube 26. A stainless steel pole 58 is slidably disposed through a Wilson seal 60. At the end of the pole 58, a graphite heating table 62 is secured via a graphite pole 64. During the liquidphase epitaxial growth operation, the graphite heating table 62 is pushed down to be disposed in an electromagnetic field established by the coil 32, such that the graphite table 62 is heated up due to the radio frequency current generated in the coil 32, whereby the silicon carbide seed layer is heated up by means of the ensuing radiation. If required, the surface of the graphite heating table 62 is coated by a silicon carbide layer. The graphite heating table 62 is maintained at the upper section of the reactor tube 26 in the process, other than the liquid-phase epitaxial growth operation, wherein the graphite heating table 62 is not heated.

The third embodiment of the method of making the silicon carbide substrate will be described with reference to FIGS. 6(A) through 6(D). Like elements corresponding to those of FIGS. 4(A) through 4(D) are indicated by like numerals.

[EXAMPLE]

(FIGS. 5 and 6(A) through 6(D))

Figure 6A:
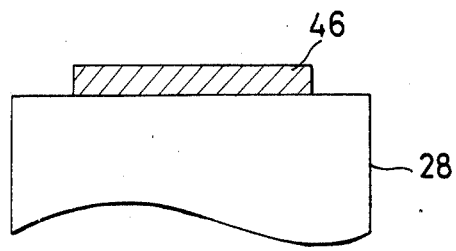
FIGS. 6(A) through 6(D) are sectional views showing fabrication steps of a silicon carbide substrate in accordance with the third embodiment of the present invention.

(1) The silicon substrate 46 is disposed on the SiC coated graphite susceptor 28 as shown in FIG. 6(A). The silicon substrate 46 preferably has the (111) major surface. The gas contained in the reactor tube 26 is substituted by the hydrogen gas. Thereafter, the silicon substrate surface is etched through the use of a mixture gas comprising hydrogen chloride and hydrogen.

Figure 6B:
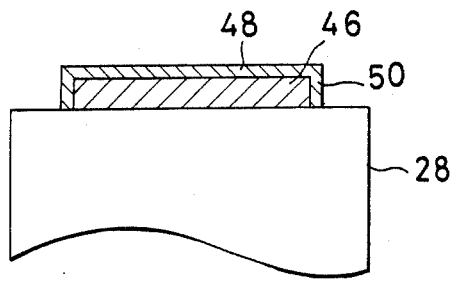

(2) A silicon carbide seed layer 48 is formed on the silicon substrate 46 through the use of the conventional chemical vapor deposition technique under the condition where the silicon substrate 46 is held at 1100° C. through 1200° C., which is below the melting point of silicon. Argon, helium or hydrogen gas is introduced through the conduit 56 as the carrier gas; $SiCl_4$, $SiH_2Cl_2$ or $SiH_4$ functioning as the silicon source, and $CCl_4$, $C_3H_8$ or $CH_4$ functioning as the carbon source, are also introduced through the conduit 56. In a preferred form, the hydrogen gas having a flow rate of 1l/min. is used for the carrier gas, and $SiH_2Cl_2$ and $C_3H_8$ are introduced at a concentration of $2 \times 10^{-3}$ and $4 \times 10^{-3}$ atomic ratio, respectively. The silicon carbide seed layer 48 comprises the 3C type SiC. However, the present formation method works well even when the seed layer 48 includes a slight amount of silicon. The seed layer 48 is formed on the silicon substrate 46 by a two hour growth to a thickness of 30 μm. At this moment, the mixed layer 48 includes SiC grains (having a diameter around 1000°) aligned in a direction determined by the crystal structure of the silicon substrate 46 at the boundary section confronting the silicon substrate 46. Another seed layer 50 is also formed on the side wall of the silicon substrate 46 as shown in FIG. 6(B). The silicon carbide [SiC] layer formed on a silicon crystal having a crystal surface [111] shows the crystal construction [111]. If the silicon carbide layer is formed on a silicon crystal having a crystal surface [110], the silicon carbide layer shows the crystal construction [110]. That is, the crystal construction of the silicon carbide layer is determined by the crystal construction of the silicon crystal on which the silicon carbide layer is formed. More specifically, $$Si<111>//SiC<111>$$

and $$Si<1\bar{1}0>//SiC<1\bar{1}0>$$

where: // means parallel.

Figure 6C:
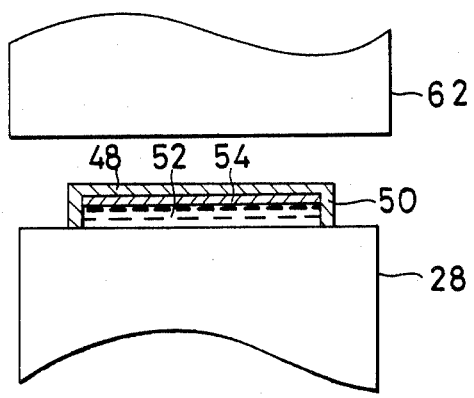

(3) The source gas supply is terminated, and only the hydrogen carrier gas is introduced at a flow rate of 1l/min. The graphite heating table 62 is pushed down to a position near the seed layer 48, as shown in FIG. 6(C). The electric power applied to the coil 32 is increased to heat the susceptor 28 up to around 1500° C. for melting the silicon substrate 46. After the melting operation, the susceptor 28 is maintained at 1450° C. through 1650° C. to hold the silicon in the molten condition. In a preferred form, the susceptor surface is maintained at 1500° C. At this moment, the seed layer temperature is held at a desired value by controlling the position of the graphite heating table 62. In a preferred form, the seed layer 48 is held at 1450° C. The second silicon carbide layer 54 is formed on the inner surface of the silicon carbide seed layer 48 to a thickness of 10 μm after a two hour period of liquid-phase epitaxial growth.

(4) The power supply to the coil 32 is terminated to cool the system to room temperature. The thus obtained silicon carbide substrate inclusive of the susceptor 28 is dipped into an acid mixture comprising HF and $HNO_3$ to etch away the silicon fixed to the silicon carbide substrate and the susceptor 28. In this way, the silicon carbide substrate comprising the seed layer 48 and the second silicon carbide layer 54, as shown in FIG. 6(D), is demounted from the susceptor 28.

In the above-mentioned second and third embodiments, the thickness of the second silicon carbide layer 54 is limited around 10 μm. This is because the amount of the material silicon is limited, and the molten silicon temperature must be maintained below 1650° C. in order to preclude the substantial vaporization of the molten silicon. If a thicker silicon carbide layer is required, another silicon carbide layer is epitaxially grown on the above-mentioned second silicon carbide layer 54.

Figure 7:
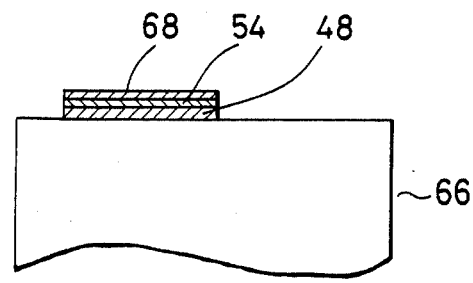
FIG. 7 is a sectional view showing a further fabrication step of a silicon carbide substrate in accordance with a fourth embodiment of the present invention.
Figure 8:
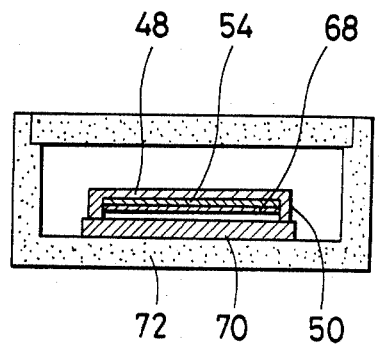
FIG. 8 is a sectional view showing a further fabrication step of a silicon carbide substrate in accordance with a fifth embodiment of the present invention.

FIGS. 7 and 8 show further steps for thickening the silicon carbide layer.

Figure 6D:
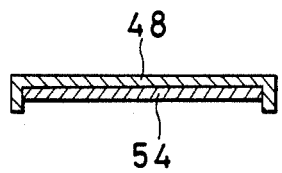

FIG. 7 shows one embodiment of a further step for thickening the silicon carbide layer obtained by the third embodiment shown in FIGS. 6(A) to 6(D). Like elements corresponding to those of FIG. 6(D) are indicated by like numerals.

[EXAMPLE]

(FIGS. 5, 6(A) through 6(D), and 7)

Steps (1) through (4) are similar to those described with reference to FIGS. 6(A) through 6(D).

(5) The seed layer 50 is removed through the use of the scribe method whereby the semiconductor substrate is cut along a scribed line.

(6) The thus obtained silicon carbide substrate comprising the seed layer 48 and the second silicon carbide layer 54 is disposed on a new susceptor 66 within the reactor tube 26 in a fashion that the seed layer 48 contacts the susceptor 66. The susceptor 66 is heated up to 1700° C., and a third silicon carbide layer 68 is formed on the second silicon carbide layer 54 through the use of the chemical vapor deposition method as shown in FIG. 7. The pressure in the reactor is held at around 100 Torr, and the gases of the following composition are introduced:

$SiH_2Cl_2$: 0.1 Ncc/min.
$C_3H_8$: 0.1 Ncc/min.
$H_2$: 100 Ncc/min.

After a one hundred minute operation, a third silicon carbide layer 68 of about 50 μm in thickness is formed on the second silicon carbide layer 54.

FIG. 8 shows another embodiment of a further step for thickening the silicon carbide layer obtained by the third embodiment shown in FIGS. 6(A) through 6(D). Like elements corresponding to those of FIG. 7 are indicated by like numerals.

[EXAMPLE]

(FIGS. 5, 6(A) through 6(D), and 8)

Steps (1) through (4) are similar to those described with reference to FIGS. 6(A) through 6(D).

(5) A silicon carbide source plate 70 is disposed in a graphite container 72. The silicon carbide source plate 70 can be either of the single crystal structure or of the polycrystal structure. The silicon carbide substrate comprising the seed layer 48, 50 and the second silicon carbide layer 54, as shown in FIG. 6(D), is disposed on the silicon carbide source plate 70 in a fashion that the second silicon carbide layer 54 confronts the silicon carbide source plate 70. The seed layer 50 formed on the side wall functions to separate the second silicon carbide layer 54 from the silicon carbide source plate 70 by a distance suited for the close space method. The expression "close space method" refers to the silicon carbide formation process wherein the object, in this instance the seed layer 48 or the silicon carbide layer 54, and the primary carbon source plate 70, are in very close proximity so as to be slightly spaced apart. The system is heated through the use of the induction heating method up to 2100° C. through 2600° C. under the condition where the ambience is a low pressure argon gas or a low pressure helium gas. The third silicon carbide layer 68 is formed on the second silicon carbide layer 54 as shown in FIG. 8 by virtue of the close space method. The third layer 68 is primarily derived from the silicon carbide source plate 70 although a negligible amount is possibly also derived from the silicon carbide layers 50 and 54.

The silicon carbide substrate fabricated through the above-mentioned embodiments includes the silicon carbide seed layer. If required, the seed layer can be removed from the second silicon carbide layer through the use of the lapping method (mechanical polishing) or the chemical etching method. Since the seed layer has a lower quality as compared with the second silicon carbide layer, only the seed layer can be etched by properly controlling the etching condition.

[EXAMPLE]

The silicon carbide substrate comprising the seed layer 48 and the second silicon carbide layer 54 is formed through the steps (1) through (4), which have been described with reference to FIGS. 6(A) through 6(D).

(5) The silicon carbide substrate comprising the seed layer 48 and the second silicon carbide layer 54 is dipped into molten potassium hydroxide held at 550° C. within the nitrogen atmosphere. After a ten minute dip, the substrate is taken out and cleaned by water, thereby removing the seed layer 48. The etching operation should be performed around 550° C. in order to protect the second silicon carbide layer 54 from being damaged by, for example, pits.

(6) On the thus obtained silicon carbide substrate consisting of the second silicon carbide layer 54, a third silicon carbide layer can be formed, if required, through the use of the epitaxial growth method to thicken the silicon carbide substrate.

FIGS. 9(A) through 9(D) show fabrication steps of a silicon carbide substrate in accordance with a sixth embodiment of the present invention.

The reactor tube 26 shown in FIG. 3 is used. Like elements corresponding to those of FIGS. 4(A) through 4(D) are indicated by like numerals.

[EXAMPLE]

(FIG. 3 and FIGS. 9(A) through 9(D))

Figure 9A:
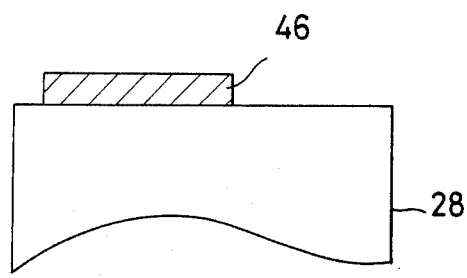
FIGS. 9(A) through 9(D) are sectional views showing fabrication steps of a silicon carbide substrate in accordance with a sixth embodiment of the present invention.

(1) A silicon substrate 46 is disposed on the SiC coated graphite susceptor 28 as shown in FIG. 9(A). The silicon substrate 46 preferably has the (111) major surface. The gas contained in the reactor tube 26 is substituted by the hydrogen gas. Thereafter, the silicon substrate surface is etched through the use of a gas mixture comprising hydrogen chloride and hydrogen.

(2) A silicon carbide seed layer 48 is formed on the silicon substrate 46 through the use of the conventional chemical vapor deposition technique under the condition where the silicon substrate 46 is held at 1200° C. through 1300° C., which is below the melting point of silicon. Argon, helium or hydrogen gas is used as the carrier gas; $SiCl_4$, $SiH_2Cl_2$ or $SiH_4$ is used for the silicon source, and $CCl_4$, $C_3H_8$ or $CH_4$ is used for the carbon source.

Figure 9B:
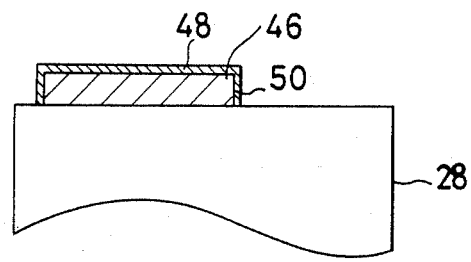

In a preferred form, the hydrogen gas at a flow rate of 1 l/min. is used for the carrier gas, and $SiH_2Cl_2$ and $C_3H_8$ are introduced at a concentration of $2 \times 10^{-3}$ and $4 \times 10^{-3}$ atomic ratio, respectively. A silicon carbide seed layer 48 comprising polycrystal SiC is formed on the silicon substrate 46 by a period of growth of about 100 minutes to the thickness of 25 μm. Another seed layer 50 is also formed on the side wall of the silicon substrate 46, as shown in FIG. 9(B).

Figure 9C:
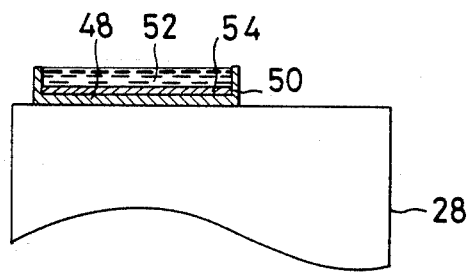

(3) The electric power supply to the coil 32 is terminated to cool the system. The susceptor 28 is removed from the reactor tube 26 in order to turn over the silicon carbide substrate comprising the silicon substrate 46 and the seed layer 48. More specifically, the outer surface of the seed layer 48 is placed on the susceptor 28, and the silicon substrate 46 faces upward. The susceptor 28 supporting the turned over silicon carbide substrate is again disposed in the reactor tube 26, to which the hydrogen gas having a flow rate of 1 l/min. is supplied. The electric power is applied to the coil 32 to heat the susceptor 28 up to around 1500° C. for melting the silicon substrate 46. After the melting operation, the susceptor 28 is maintained at 1450° C. through 1650° C. In a preferred form the susceptor surface is maintained at 1500° C. A single crystal second silicon carbide layer 54 is formed on the inner surface of the silicon carbide seed layer 48 to the thickness 10 μm after a period of one hour of liquid-phase epitaxial growth, as shown in FIG. 9(C). The seed layer 50 functions to retain the molten silicon 52.

Figure 9D:
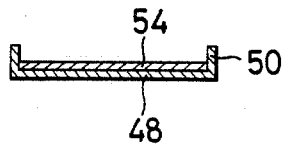

(4) The power supply to the coil 32 is terminated to cool the system. The thus obtained silicon carbide substrate is removed and dipped into an acid mixture comprising HF and $HNO_3$ for etching the silicon fixed to the silicon carbide substrate. In this way, the silicon carbide substrate comprising the seed layer 48, 50 and the single crystal silicon carbide layer 54 is obtained as shown in FIG. 9(D).

Figure 10:
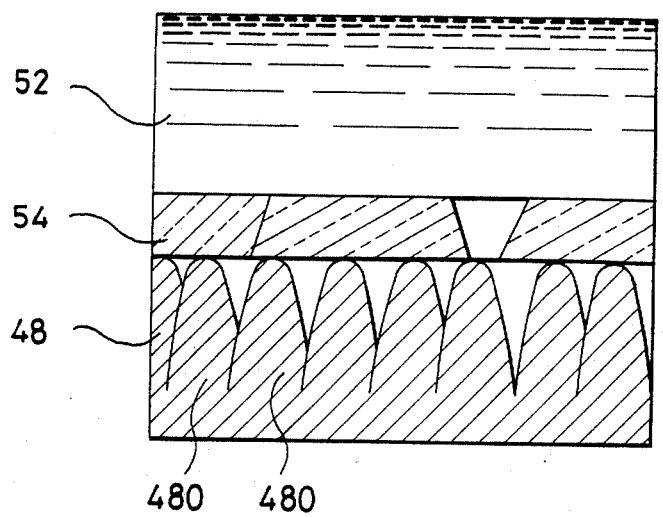
FIG. 10 is an enlarged sectional view showing the liquid-phase epitaxial growth of the single crystal silicon carbide layer at the step shown in FIG. 9(C)

The liquid-phase epitaxial growth of the single crystal silicon carbide second layer 54 in the abovementioned step (3) can be considered as follows. The silicon carbide seed layer 48 is a congregated layer of a plurality of fiber shaped grains 480. The center of the fiber shaped grain 480 has a more complete crystal structure than the periphery of the fiber shaped grain 480. Accordingly, when the silicon carbide seed layer 48 contacts the molten silicon 52 during the abovementioned step (3), the periphery section of the fiber shaped grain 480 dissolves into the molten silicon 52. A portion of the thus dissolved seed layer is recrystallized on the center of the fiber shaped grain 480, whereby the second silicon carbide layer 54 is epitaxially grown on the seed layer 48 as shown in FIG. 10. Since the fiber shaped grains 480 are formed on the (111) major surface of the silicon substrate 46 and the second silicon carbide layer 54 is grown on the fiber shaped grains 480, the grains in the second silicon carbide layer 54 are aligned in a predetermined direction determined by the silicon substrate 46. The thus obtained second silicon carbide layer 54 can be considered as the single crystal structure even though a triangular hole may be formed in the second silicon carbide layer 54 when the (111) major surface of the silicon substrate 46 is used.

During the above-mentioned step (2), there is a possibility that a polycrystal SiC thin-film is formed on the rear surface of the silicon substrate 46. The thus formed polycrystal SiC thin-film may have an influence on the growth of the silicon carbide second layer 54 and on the seed layer 48 during the step (3). Accordingly, if required, the above-mentioned polycrystal SiC thin-film should be removed before step (3) through the use of mechanical polishing.

FIGS. 11(A) through 11(D) show fabrication steps of a silicon carbide substrate in accordance with a seventh embodiment of the present invention. Like elements corresponding to those of FIGS. 9(A) through 9(C) are indicated by like numerals.

[EXAMPLE]
(FIGS. 11(A) through 11(D))

Figure 11:
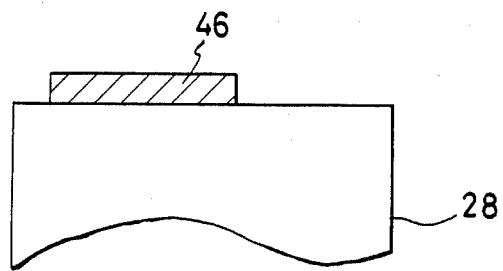
FIGS. 11(A) through 11(D) are sectional views showing fabrication steps of a silicon carbide substrate in accordance with a seventh embodiment of the present invention.
Figure 11:
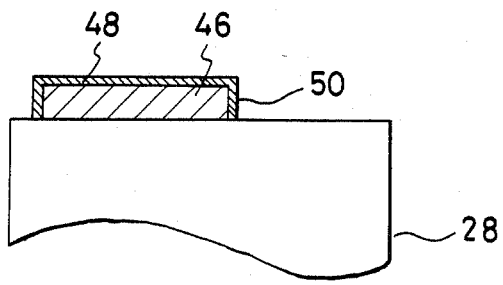
Figure 11:
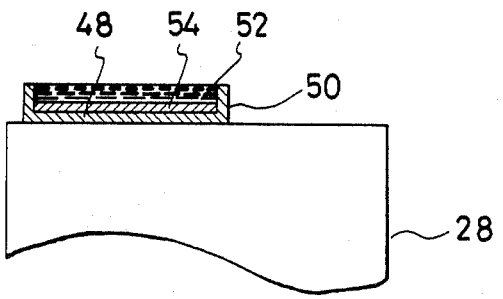
Figure 11:
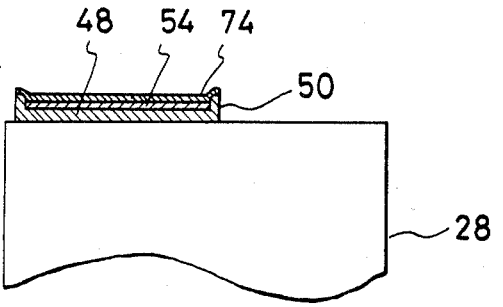

The second silicon carbide layer 54 is formed on the silicon carbide seed layer 48 as shown in FIG. 11(C) through the steps (1) through (3) which have been discussed with reference to FIGS. 9(A) through 9(C).

(4) The electric power applied to the coil 32 is further increased to heat the susceptor 28 up to around 1700° C. The pressure in the reactor tube 26 is reduced to about 100 Torr, whereby the molten silicon 52 is gradually evaporated. While the reactor tube 26 is held around 100 Torr, a mixture gas comprising the following components is introduced:

$SiH_2Cl_2$: 0.1 Ncc/min.
$C_3H_8$: 0.1 Ncc/min.
$H_2$: 100 Ncc/min.

A third silicon carbide layer 74 is formed on the second silicon carbide layer 54 as shown in FIG. 11(D) through the use of the chemical vapor deposition method. After one hundred minute operation, the third silicon carbide layer 74 of 50 μm thick is obtained.

By employing the above-mentioned fourth step, the silicon carbide layer can be thickened and, moreover, the triangular hole, discussed with reference to the embodiment of FIGS. 9(A) through 9(D), can be made to disappear. Since the steps (3) and (4) of FIGS. 11(C) and 11(D) can be continuously performed, the embodiment of FIGS. 11(A) through 11(D) is very effective.

As already discussed with reference to various embodiments, the silicon carbide seed layer 48 is not necessarily a single crystal structure. The silicon carbide seed layer 48 can be a polycrystal structure which has grains well orientated in a predetermined direction, which is determined by the orientation of the silicon substrate 46. The thus well orientated grains, which are contacted withthe melted silicon during the liquid-phase epitaxial growth step, ensure the formation of the single crystal second silicon carbide layer 54.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for fabricating a silicon carbide substrate comprising the steps of:
    providing a clean surface silicon base plate;
    depositing a silicon carbide seed layer on said clean surface silicon base plate, said silicon carbide seed layer including a first surface confronting said clean surface silicon base plate;
    displacing said silicon base plate; and
    exposing said first surface of said silicon carbide seed layer to molten silicon including carbon material therein, whereby a second silicon carbide layer is epitaxially grown on said first surface of said silicon carbide seed layer.

2. The method of claim 1, wherein said silicon carbide seed layer is deposited on a (111) major surface of said clean surface silicon base plate.

3. The method of claim 2, wherein said silicon carbide seed layer includes grains well oriented in a predetermined direction defined by said (111) major surface of said clean surface silicon base plate at said first surface of said silicon carbide seed layer.

4. The method of claim 1, 2 or 3, further comprising the step of forming a third silicon carbide layer on said second silicon carbide layer.

5. The method of claim 1, 2 or 3, further comprising the step of removing said silicon carbide seed layer from said second silicon carbide layer after formation of said second silicon carbide layer.

6. A method for fabricating a silicon carbide substrate comprising the steps of:

disposing a clean surface silicon base plate on a graphite susceptor coded with silicon carbide;

depositing a silicon carbide seed layer on said clean surface silicon base plate while said susceptor is maintained at a temperature below the melting point of said clean surface silicon base plate, said silicon carbide seed layer including a first surface confronting said clean surface silicon base plate;

melting said clean surface silicon base plate by heating said susceptor above said melting point of said clean surface silicon base plate, whereby a second silicon carbide layer is liquid-phase epitaxially grown on said first surface of said silicon carbide seed layer;

cooling said molten silicon, said silicon carbide seed layer and said second silicon carbide layer; and removing silicon from said silicon carbide substrate.

7. The method of claim 6, wherein said silicon carbide seed layer is deposited on a (111) major surface of said clean surface silicon base plate.

8. The method of claim 6, wherein said silicon carbide seed layer includes grains well orientated in a predetermined direction defined by said (111) major surface of said clean surface silicon base plate at said first surface of said silicon carbide seed layer.

9. The method of claim 6, wherein said graphite susceptor is heated so that the surface thereof shows a temperature about 1500° C. while said second silicon carbide layer is epitaxilally grown on said first surface of said silicon carbide seed layer.

10. The method of claim 9, wherein said graphite susceptor is heated through the use of a radio frequency induction heating.

* * * * *